(12) United States Patent
Soules et al.

(10) Patent No.: US 8,529,859 B2
(45) Date of Patent: Sep. 10, 2013

(54) METHOD FOR FABRICATING APATITE CRYSTALS AND CERAMICS

(75) Inventors: Thomas F. Soules, Livermore, CA (US); Kathleen I. Schaffers, Livermore, CA (US); John B. Tassano, Jr., Manteca, CA (US); Joel P. Hollingsworth, Oakland, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 279 days.

(21) Appl. No.: 13/043,072

(22) Filed: Mar. 8, 2011

(65) Prior Publication Data

US 2011/0224065 A1 Sep. 15, 2011

Related U.S. Application Data

(60) Provisional application No. 61/312,028, filed on Mar. 9, 2010.

(51) Int. Cl.
*C01F 17/00* (2006.01)
*C01B 25/16* (2006.01)
*C01B 25/32* (2006.01)

(52) U.S. Cl.
USPC ............... 423/263; 23/304; 117/11; 117/941; 423/306; 423/308; 423/309; 423/311

(58) Field of Classification Search
USPC ............... 117/11, 941; 23/304; 423/263, 423/306, 308, 309, 311
See application file for complete search history.

(56) References Cited

U.S. PATENT DOCUMENTS 5,767,405 A 6/1998 Bernstein et al.

OTHER PUBLICATIONS

Peizhi Yang et al, "Growth of Yb-doped calcium fluorapatite crystal", Guisuanyan Xuebao (1999), 27(2), 219-223.*
S. Apinitis et al, "X-ray diffraction study of barium chloro- and bromoapatites activated by neodymium", Latvijas PSR Zinatnu Akademijas Vestis, Kimijas Serija (1983), (4), 398-401.*
G.B. Loutts et al, "Growth of high-quality single crystals of FAP [Ca5(PO4)3F] and its isomorphs", Proceedings of SPIE—The International Society for Optical Engineering (1993), 1863 (Growth, Characterization, and Applications of Laser Host and Nonlinear Crystals II), 31-4.*
G.B. Loutts et al, "Crystal growth, spectroscopic characterization, amnd laser performance of a new efficient laser material Nd:Ba5(PO4)3F", Appl. Phys. Lett. 71 (3), Jul. 21, 1997.*
Akiyama, et al., Advanced Solid-State Photonics, OSA Optics and Photonics Congress, 3 pages (2009).
Matsumine, et al., "Calcium hydroxyapatite ceramic implants in bone tumour surgery," *J Bone Joint Surg.*, vol. 86-B (5), pp. 719-725 (2004).
Meyer, et al., "Inhibition of Calcium Phosphate Crystallization by Nucleoside Phosphates", Calc. Tiss. Res., 15, pp. 287-293 (1974).
Payne, et al., "Laser, Optical, and Thermomechanical Properties of Yb-doped Fluorapatite", IEEE Journal of Quantum Electronics, vol. 30, No. 1, pp. 170-179, (Jan. 1994).

(Continued)

*Primary Examiner* — Wayne Langel
(74) *Attorney, Agent, or Firm* — Kilpatrick Townsend Stockton

(57) ABSTRACT

The present invention provides a method of crystallizing Yb:C-FAP [$Yb^{3+}$:$Ca_5(PO_4)_3F$], by dissolving the Yb:C-FAP in an acidic solution, following by neutralizing the solution. The present invention also provides a method of forming crystalline Yb:C-FAP by dissolving the component ingredients in an acidic solution, followed by forming a supersaturated solution.

17 Claims, 1 Drawing Sheet

(56) References Cited

OTHER PUBLICATIONS

Jaffe, et al., "Total Hip Arthoplasty with Hydroxypatite-Coated Prostheses", The Journal of Bone and Joint Surgery, 17 pages, (1993).
Rodriguez-Lorenzo, "Controlled Crystallization of Calcium Phosphate Apatites", Chem. Mater, 12, pp. 2460-2465, (2000).
Zaitseva, et al., "Rapid Growth of KDP-type Crystals", Progress of Crystal Growth and Charaterization, pp. 1-118, (2001).
Guerra-Lopez, et al., "Influence of Nickel on Hydroxyapatite crystallization", Journal of Raman Spectroscopy, 32, pp. 255-261 (2001).
Schaffers, et al., "Growth of Yb: S-FAP [Yb3+:Sr(PO4)3F] crystals for the Mercury laser", Science Direct, Journal of Crystal Growth, 253, pp. 297-306 (2003).
Ehhrlich, et al., "Chitosan Membrane as a template for hydrozpatite crystal growth in a model dual membrane diffusion system", Journal of Membrane Science, 273, pp. 124-128 (2006).
Yoreo, et al., "Molecular Modulation of Calcium Oxolate Crystallization", Am J. Physiol Renal Physiol, 291, pp. F1123-F1131, (2006).
Tarasevich, et al., "The nucleation and growth of calcium phosphate by amelogenin", Journal of Crystal Growth, 304, pp. 407-415 (2007).
Vani, et al., "Simultaneous crystallization of calcium phosphate and calcium oxalate in the presence of ascorbic acid under physiological conditions", Materials Science and Engineering C, 29, pp. 1227-1232 (2009).
Kandori, et al., Preparation and charaterization of calcium hydroxyapatite and balloon-like calcium phosphate particles from forced hydrolysis of Ca(OH)2-triphosphate, Polyhedron, 28, pp. 3036-3042 (2009).

* cited by examiner

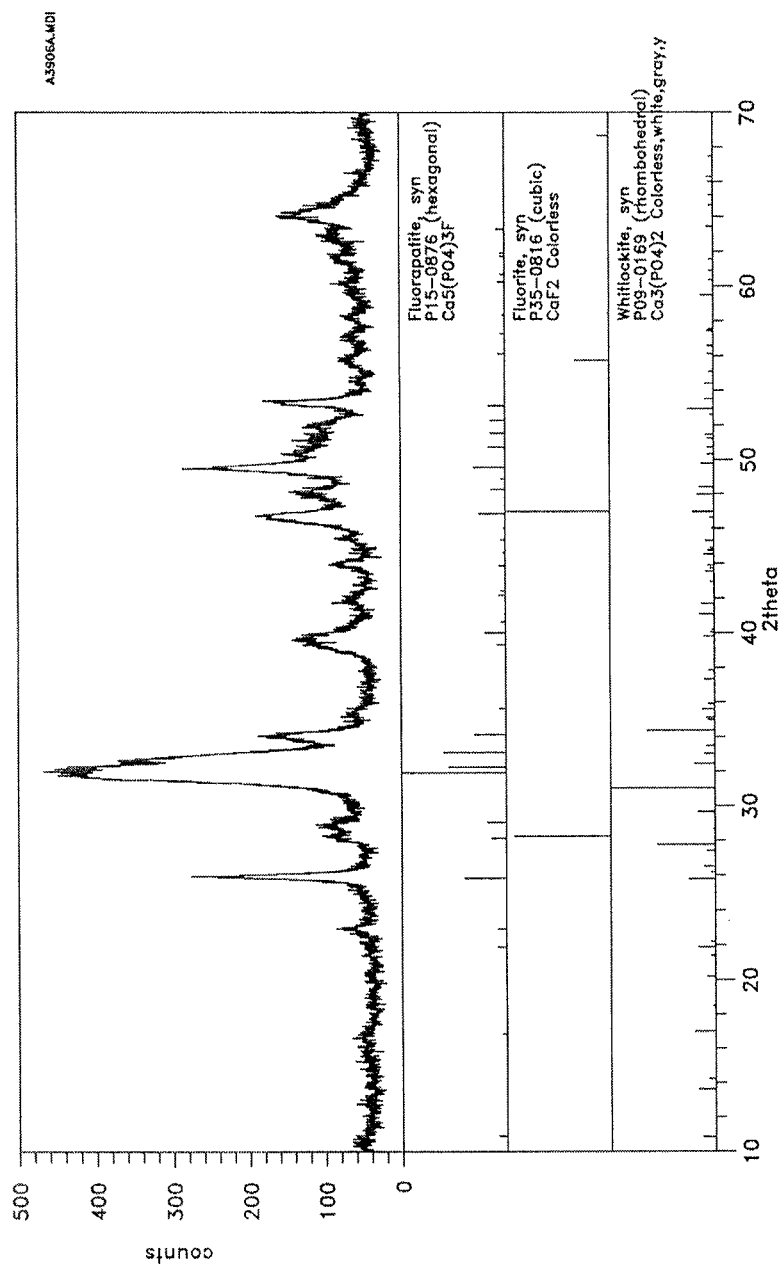

METHOD FOR FABRICATING APATITE CRYSTALS AND CERAMICS

CROSS-REFERENCES TO RELATED APPLICATIONS

This application claims priority to U.S. Provisional Application No. 61/312,028, filed Mar. 9, 2010, which is incorporated in its entirety herein for all purposes.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

Crystals of the apatite group are prevalent in nature. The mineral apatite itself, typically close in composition to $Ca_{10}(PO_4)_6F_2$, is widely disseminated as an accessory phase in all classes of rock, i.e. igneous, sedimentary, and metamorphic (C. S. Hurlbut, Jr., et al., Manual of Mineralogy, 19th ed., John Wiley and Sons, (1977)). A wide range of synthetic crystals of the apatite group have been studied for their potential usefulness as laser ceramics. Single crystals of $Sr_{10}(PO_4)_6F_2$ ("SFAP"), or Sr-fluorapatite, have been evaluated as Yb-doped solid state laser crystals (L. D. DeLoach et al., J. Opt. Soc. Am. B, 11:269-76 (1994)). Other Yb-doped apatite crystals are also being investigated as laser materials, such as Yb:C-FAP [$Yb^{3+}:Ca_5(PO_4)_3F$]. What is needed are single crystals of the Yb-doped apatite crystals, and methods for making them. Surprisingly, the present invention meets these, and other needs.

BRIEF SUMMARY OF THE INVENTION

In one embodiment, the present invention provides a crystalline form of a compound of formula I:

$$(A_{1-n}Y_n)_5(PO_4)_3X \quad (I)$$

wherein A is Ca, Sr or Ba; Y is a dopant Yb, Nd, Ce, Cr, Tm, Ho, Er, or Sm; subscript n is from 0 to about 0.1; and X can be F, Cl or OH. The compound of formula I can be prepared by the process of dissolving a compound of formula I in an aqueous solution having an acid, wherein the solution is at a temperature of less than about 100° C. The method also includes forming a supersaturated solution, thereby preparing a crystalline form of the compound of formula I.

In another embodiment, the present invention provides a method of preparing a crystalline form of a compound of formula I:

$$(A_{1-n}Y_n)_5(PO_4)_3X \quad (I)$$

wherein A, Y, X and n are as described above for formula I. The method of crystallizing a compound of formula I includes dissolving the compound of formula I in an aqueous solution including an acid, wherein the solution is at a temperature of less than about 100° C. The method also includes forming a supersaturated solution, thereby preparing the crystalline form of the compound of formula I.

In other embodiments, the present invention provides a method of preparing a crystalline form of a compound of formula I, the method including dissolving an alkaline earth fluoride, an alkaline earth phosphate, an alkaline earth carbonate and a salt of the dopant Y in an aqueous solution including an acid, wherein the solution is at a temperature of from about 0 to about 100° C. The method also includes forming a supersaturated solution, thereby preparing a crystalline form of the compound of formula I.

BRIEF DESCRIPTION OF THE DRAWINGS

FIG. 1 shows the X-ray diffraction pattern (XRPD) of Yb:C-FAP [$Yb^{3+}:Ca_5(PO_4)_3F$] (top), and fluorapatite ($Ca_5(PO_4)_3F$), fluorite ($CaF_2$) and whitlockite ($Ca_3(PO_4)_2$) for comparison.

DETAILED DESCRIPTION OF THE INVENTION

I. General

The present invention provides a method of recrystallizing Yb:C-FAP [$Yb^{3+}:Ca_5(PO_4)_3F$]. The crystalline forms can be obtained by a variety of methods. For example, Yb:C-FAP can be recrystallized by first dissolving it in an acidic solution, followed by neutralizing the solution by adding base. The crystallization can also start from the component pieces of the compound, $CaF_2$, $Ca_3(PO_4)_2$, $Ca(CO_3)$ and a ytterbium salt, wherein Yb:C-FAP is formed in situ, and then crystallized from the solution.

II. Definitions

"Dopant" refers to a chemical element of a crystal lattice that has been added to alter the optical and/or electrical properties of the crystal. The dopant can be any suitable element from the periodic table, such as an alkali metal, an alkali earth metal, a transition metal, a rare earth metal, a platinum-group metal, a post-transition metal, metalloids and non-metals. Dopants can be neutral or charged, and can be in an oxide or salt form.

"Acid" refers to a compound that results in a pH of less than 7 when dissolved in pure water. Acids can be defined as Bronsted acids, by their willingness to donate a proton ($H^+$), or as a Lewis acid, by their willingness to accept an electron pair. Acids can be strong or weak, depending on their ability to hydrolyze in solution. Strong acids dissociate completely in water, such as hydrochloric acid, hydroiodic acid, perchloric acid, nitric acid and sulfuric acid. Weak acids only partially hydrolyze. Acids can be present in solution at a variety of concentrations. When the acid is present in the maximum concentration possible, the acid is referred to as a "concentrated acid."

"Base" refers to a compound that results in a pH of greater than 7 when dissolved in pure water. Bases can be defined as Bronsted bases by their willingness to accept a proton ($H^+$), or as Lewis bases by their willingness to donate a pair of electrons. Bases can also be strong or weak. Strong bases are those that hydrolyze completely, such as hydroxides of the alkali metals and alkali earth metals. Weak bases only weakly hydrolyze, and include, but are not limited to, ammonia, amines, ureas, and others.

"Neutralize" refers to the chemical process of neutralization where an acid and base react to form water and a salt, causing the pH of the solution to be about 7.

"Dispersant" refers to a compound in a solution that improves separation of particles and reduces settling, clumping and agglomeration of the particles. Commonly used dispersants that charge the particles include acrylic acid salts, such as DISPEX A40™. Non-ionic dispersants are also used which keep particles separated by forming a surface layer that geometrically impedes flocculation. Exemplary dispersants include, but are not limited to, Pluronics F127.

"Enzyme" refers to a protein that catalyzes chemical reactions or promotes the crystallization of compounds.

"Organic template" refers to a compound that provides a template for the formation of a particular crystal morphology. Exemplary organic templates include, but are not limited to, fatty acids such as butyric acid (C4), caproic acid (C6), caprylic acid (C8), capric acid (C10), lauric acid (C12), myristic acid (C14), palmitic acid (C16), palmitoleic acid (C16), stearic acid (C18), isostearic acid (C18), oleic acid (C18), vaccenic acid (C18), linoleic acid (C18), alpha-linoleic acid (C18), gamma-linolenic acid (C18), arachidic acid (C20), gadoleic acid (C20), arachidonic acid (C20), eicosapentaenoic acid (C20), behenic acid (C22), erucic acid (C22), docosahexaenoic acid (C22), lignoceric acid (C24) and hexacosanoic acid (C26). In the human body, the fatty acid, such as arachidic acid, interacts with hydroxyapatite and effects the morphology of the hydroxyapatite as it forms the structure of bones and teeth (K. Sato, Y. Kumagai, K, Watari and J. Tanaka, Mat. Res. Soc. Proceedings, Fall, 2003).

"Morphology" refers to the shape and form of a material.

"Alkaline earth fluoride" refers to a fluoride ($F^-$) salt of an alkaline earth metal, and has the formula $MF_2$, where M is the alkaline earth metal. Exemplary alkaline earth fluorides include, but are not limited to, $CaF_2$.

"Alkaline earth phosphate" refers to salts of an alkaline earth metal and phosphate ion ($PO_4^{3-}$) and have the formula $M_3(PO_4)_2$, where M is the alkaline earth metal. Exemplary alkaline earth phosphates include, but are not limited to, $Ca_3(PO_4)_2$.

"Alkaline earth carbonate" refers to salts of an alkaline earth metal and carbonate ion ($CO_3^{2-}$), and have the formula $M(CO_3)$, where M is the alkaline earth metal. Exemplary alkaline earth carbonates include, but are not limited to, $Ca(CO_3)$.

"Alkaline earth hydroxide" refers to salts of an alkaline earth metal and hydroxide ion ($OH^-$), and has the formula $M(OH)_2$, where M is the alkaline earth metal. Exemplary alkaline earth hydroxides include, but are not limited to, $Ca(OH)_2$.

"Aqueous solution" refers to a solution composed primarily of water. The aqueous solution can also include water miscible solvents which include, but are not limited to, alcohols, DMSO, DMF, tetrahydrofuran, and others.

"Metal" refers to metallic elements of the periodic table that can be neutral or positively charged as a result of having fewer electrons in the valence shell than is present for the neutral metallic element. Metals that are useful in the present invention include the alkali metals, alkali earth metals, transition metals, rare earth metals and post-transition metals. Alkali metals include Li, Na, K, Rb and Cs. Alkaline earth metals include Be, Mg, Ca, Sr and Ba. Transition metals include Sc, Ti, V, Cr, Mn, Fe, Co, Ni, Cu, Zn, Y, Zr, Nb, Mo, Tc, Ru, Rh, Pd, Ag, Cd, La, Hf, Ta, W, Re, Os, Ir, Pt, Au, Hg and Ac. Rare earth metals include Sc, Y and the lanthanides La, Ce, Pr, Nd, Pm, Sm, Eu, Gd, Tb, Dy, Ho, Er, Tm, Yb and Lu. Post-transition metals include Al, Ga, In, Tl, Ge, Sn, Pb, Sb, Bi, and Po. One of skill in the art will appreciate that the metals described above can each adopt several different oxidation states. In some instances, the most stable oxidation state is formed, but other oxidation states are useful in the present invention.

"Amine" refers to compounds of the formula $NR_3$, wherein each R group can be hydrogen or any substituent such as, but not limited to, alkyl, alkenyl, alkynyl, cycloalkyl, heterocycloalkyl, aryl and heteroaryl.

III. Crystalline Compounds

The methods of the present invention provide crystalline forms of the compound of formula I. In some embodiments, the present invention provides a crystalline form of a compound of formula I:

$$(A_{1-n}Y_n)_5(PO_4)_3X \tag{I}$$

wherein A is a metal having a +2 charge, Y is a dopant, and X is a counterion.

Metal A of formula I can be any suitable metal. Metals useful as A of formula I include any metal that can form a +2 charge, such as, but not limited to, alkaline earth metals, transition metals and post-transition metals. Suitable alkaline earth metals include Be, Mg, Ca, Sr and Ba. Suitable transition metals include V, Cr, Mn, Fe, Co, Ni, Cu, Zn, Mo, Ru, Rh, Pd, Cd, W, Re, Os, Ir, Pt, and Hg. Suitable post-transition metals include Sn, Pb, and Po. In some embodiments, radical A is an alkali earth metal. In other embodiments, radical A is Ca, Sr or Ba.

The dopant Y can be any suitable dopant. Dopants useful in the compounds of the present invention include the transition metals, rare earth metals and post-transition metals as well as metalloids and non-metals. Dopants include optically active ions, such as a transition metal or rare-earth metal, capable of absorbing pump light radiation and emitting this radiation either spontaneously or through stimulated emission, lasing. Suitable transition metals include Ti, V, Cr, Mn, Fe, Co, Ni. Suitable rare earth metals include Yb and the lanthanides La, Ce, Pr, Nd, Pm, Sm, Eu, Gd, Tb, Dy, Ho, Er, Tm, Yb and Lu. Dopants useful in the crystalline compounds of the present invention include, but are not limited to, Yb, Nd, Ce, Cr, Tm, Ho, Er and Sm. In some embodiments, the dopant is ytterbium.

The counterion X can be any suitable counterion having a −1 charge. Suitable counterions include, but are not limited to, halogens such as F, Cl, Br and I, as well as OH. Other counterions are suitable in the crystalline compounds of the present invention.

In some embodiments, the crystalline forms of the compound are those of formula I wherein radical A is Ca, Sr or Ba; radical Y is a dopant of Yb, Nd, Ce, Cr, Tm, Ho, Er, or Sm; subscript n is from 0 to about 0.1; and radical X can be F, Cl or OH.

In other embodiments, the crystalline compounds of the present invention have formula Ia:

$$A_5(PO_4)_3X \tag{Ia}$$

In some other embodiments, the crystalline compounds of the present invention have the formula Ib:

$$(Ca_{1-n}Yb_n)_5(PO_4)_3F \tag{Ib}$$

Subscript n of formula Ib can be from 0 to about 0.1 When subscript n of formula Ib is 0, the compounds of the present have the formula: $Ca_5(PO_4)_2F$. In still other embodiments, the crystalline compounds of the present invention are those where subscript n of formula Ib is about 0.01.

In another embodiment, the present invention provides a crystalline form of a compound of formula I prepared by the process of dissolving a compound of formula I in an aqueous solution having an acid, wherein the solution is at a temperature of less than about 100° C. The method also includes adding a base to the solution to neutralize the solution, thereby preparing a crystalline form of the compound of formula I.

The crystalline forms of the compounds of the present invention can have any suitable length and diameter. In some embodiments, the crystalline forms of the compound of formula I are those having a diameter of from about 0.01 to about 100 μm, preferably of from about 0.1 to about 50 μm. In other embodiments, the crystalline forms of the compound of formula I are those having a diameter of from about 0.1 to about 15 μm. Suitable lengths of the crystalline forms of the compounds of the present invention are from about 0.001 to about 10 mm, preferably from about 0.01 to about 1 mm, more preferably from about 0.1 to about 1 mm. Other diameters and lengths of the crystalline compounds of the present invention can be prepared by the methods of the present invention.

The crystalline forms of the compounds of the present invention can have any suitable morphology. In some embodiments, the crystalline forms of the compound of formula I include those having a morphology in the form of a whisker, rosette, sphere, needle, platelet, fiber, or flake. Other morphologies are suitable for the crystalline forms of the compounds of the present invention.

In still other embodiments, the crystalline forms of the compound of formula Ib, wherein subscript n is about 0.01, have an X-ray crystal structure having the following 2-theta peaks: 25.978, 31.780, 32.319, 32.779, 34.082 and 49.520. In some other embodiments, the X-ray crystal structure of the compound has the following 2-theta peaks: 25.978, 28.961, 31.780, 32.319, 32.779, 34.082, 39.159, 39.742, 46.741, 49.520, 50.400 and 53.341. In yet other embodiments, the X-ray crystal structure of the compound has the following 2-theta peaks: 16.822, 22.597, 25.978, 28.219, 28.961, 31.780, 32.319, 32.779, 34.082, 35.336, 39.159, 39.742, 41.902, 43.943, 45.464, 46.741, 48.148, 49.128, 49.520, 50.400, 51.150, 51.940, 53.341, 54.437, 55.781, 57.092, 58.425, 60.194, 61.659 and 62.993. In another embodiment, crystalline form of the compound has the X-ray crystal structure of FIG. 1.

The compound of formula Ib can be prepared by dissolving $Ca_5(PO_4)_2F$ in the aqueous solution including concentrated hydrochloric acid and ytterbium, wherein the solution is at a temperature of less than about 100° C. The process can also include adding concentrated ammonium hydroxide to neutralize the solution, thereby preparing a crystalline form of $(Cs_{1-n}Yb_n)_5(PO_4)_3F$, where subscript n is about 0.01.

IV. Method of Crystallizing

The present invention provides a method of crystallizing a compound of formula I. The crystallization of the compound of formula I can be obtained by a variety of methods. For example, a compound of formula I can be dissolved in a solution, followed by modifying the properties of the solution to reduce the solubility of the compound in the solution. Reducing the solubility of the compound in the solution can be obtained by a variety of factors, including temperature, concentration, pH, and the presence of other components in the solution such as a seed crystal, dispersant, enzyme or organic template. The crystalline form of the compound of formula I can also be obtained from the component pieces of the compound of formula I, wherein the compound of formula I is formed in situ, and then crystallized from the solution. For example, the compounds of the present invention can be prepared synthetically by a solid state reaction in which precursors, such as, $ACO_3$, $AX_2$, $AHPO_4$ and the dopant $Y_2O_3$, are blended with the appropriate stoichiometric amounts and then the powder mixture is heated to a suitable temperature typically around 1100° C. to form a compound of formula I.

In some embodiments, the present invention provides a method of preparing a crystalline form of a compound of formula I:

$$(A_{1-n}Y_n)_5(PO_4)_3X \qquad (I)$$

wherein radicals A, Y, X and n are as described above for formula I. The method of crystallizing a compound of formula I includes dissolving the compound of formula I in an aqueous solution including an acid, wherein the solution is at a temperature of less than about 100° C. The method also includes forming a supersaturated solution, thereby preparing the crystalline form of the compound of formula I.

The acid used in the method of the present invention can be any suitable acid. In some embodiments, the acid can be hydrochloric, nitric, phosphoric, perchloric or sulfuric acid. The acid can be of any suitable concentration. In some other embodiments, the acid is concentrated hydrochloric acid. Other acids and concentrations are useful in the present invention.

The aqueous solution can be at any suitable temperature. For example, the temperature can be from about 0 to about 100° C., preferably from about 20 to about 100° C., more preferably from about 50 to about 70° C.

The aqueous solution can also include other components. In some embodiments, the aqueous solution also includes a dispersant, an enzyme or an organic template. Suitable dispersants include, but are not limited to, Pluronics F127. Suitable organic templates or enzymes include, but are not limited to, proteins and carboxylic acids such as arachidic acid. Other organic templates include, but are not limited to, chitosan membrane, amelogenin, citrate and osteopontin.

In some embodiments, the method of the present invention provides single crystals of the compound of formula I.

The supersaturated solution can be formed by a variety of methods. In some embodiments, the method includes adding a base to neutralize the solution. During neutralization, the solution becomes supersaturated and the apatite comes out of solution. Neutralization brings the apatite out of solution slowly so as to grow well formed crystallites. Bases useful in the present invention are preferably weak bases. In some embodiments, the base can be ammonium hydroxide, an amine, urea, sodium hydroxide, potassium hydroxide, an alkaline earth hydroxide, calcium hydroxide, or calcium carbonate. In other embodiments, the base can be ammonium hydroxide, an amine, or urea. The base can be present in any concentration suitable to alter the pH of the aqueous solution to about 7.0.

The method of the present invention can include additional steps in the preparation of the crystalline forms of the compound of formula I to assist in the formation of the crystalline compounds. In some embodiments, the method also includes slow evaporation of the aqueous solution. The evaporation can occur over a period of hours, days or weeks. In other embodiments, the method also includes decreasing the temperature of the aqueous solution. The temperature decrease can occur over a period of minutes, hours or days. In some other embodiments, the method also includes adding a seed crystal to the aqueous solution. The seed crystal can be a seed crystal of the compound of formula I.

In other embodiments, subscript n of formula I is from about 0.001 to about 0.1. In some other embodiments, subscript n of formula I is about 0.01. In still other embodiments, subscript n is 0, such that the compound prepared by the method of the present invention is a compound of formula Ia.

The crystalline forms of the compound of formula I can also be prepared by dissolving in the aqueous solution a compound of formula Ia and a salt of the dopant Y. Salts forms of the dopant Y include, but are not limited to, halogens, such as fluoride, chloride, bromide and iodide, nitrates, sulfates and perchlorates. When the dopant is ytterbium, suitable salts include, but are not limited to, $Yb_2O_3$, $Yb(NO_3)_3$, $YbCl_3$, and others.

In other embodiments, the method includes dissolving $Ca_5(PO_4)_2F$ and a ytterbium salt in an aqueous solution including concentrated hydrochloric acid, wherein the solution is at a temperature of from about 0 to about 100° C. The method also includes adding concentrated ammonium hydroxide to neutralize the solution, thereby preparing a crystalline form of $(Ca_{1-n}Yb_n)_5(PO_4)_3F$, wherein subscript n is about 0.01.

In another embodiment, the present invention provides a method of preparing a crystalline form of a compound of formula I, the method including dissolving an alkaline earth fluoride, an alkaline earth phosphate, an alkaline earth carbonate and a salt of the dopant Y in an aqueous solution including an acid, wherein the solution is at a temperature of from about 0 to about 100° C. The method also includes adding a base to neutralize the solution, thereby preparing a crystalline form of the compound of formula I.

Any suitable alkaline earth fluoride, alkaline earth phosphate, alkaline earth carbonate and dopant salt are useful in the method of the present invention. Alkaline earth fluorides are salts of an alkaline earth metal and fluoride ($F^-$), and have the formula $MF_2$, where M is the alkaline earth metal. Exemplary alkaline earth fluorides include, but are not limited to, $CaF_2$. Alkaline earth phosphates are salts of an alkaline earth metal and phosphate ion ($PO_4^{3-}$) and have the formula $M_3(PO_4)_2$, where M is the alkaline earth metal. Exemplary alkaline earth phosphates include, but are not limited to, $Ca_3(PO_4)_2$. Alkaline earth carbonates are salts of an alkaline earth metal and carbonate ion ($CO_3^{2-}$), and have the formula $M(CO_3)$, where M is the alkaline earth metal. Exemplary alkaline earth carbonates include, but are not limited to, $Ca(CO_3)$. Salts of the dopant are described above. In some embodiments, the method includes dissolving $CaF_2$, $Ca_3(PO_4)_2$, $Ca(CO_3)$ and a Yb salt, such as, $Yb(NO_3)_3$, in the aqueous solution.

V. Examples

Example 1

Recrystallization of Yb:C-FAP

A crystalline piece of Yb:C-FAP [$Yb^{3+}$:$Ca_5(PO_4)_3F$] was ground up with a mortar and pestle into a fine crystalline powder yielding approximately 100 grams. This powder was dissolved in ~50 milliliters of concentrated Hydrochloric Acid at 50-70° C. while stirring. Concentrated Ammonium hydroxide (aq) was added drop-wise over the course of 30 minutes to precipitate the powder back out of solution. Approximately 55 milliliters was required to drop the solution to a pH of ~7.0. The solution was stirred for 1 hour. The solid was strained from the liquid using a Buchner funnel. The solid was washed 3 times with liberal amounts of deionized water. The solid was dried at room temperature in a fume hood for 1 day and then placed into a drying oven at 125° C. for 3 days. The resulting white powder was ground in a mortar and pestle and an X-ray powder diffraction pattern was taken (see Table 1 and FIG. 1).

TABLE 1

X-ray Pattern Data for Yb:C-FAP Precipitated powder

| 2-Theta | d (Å)  | BG  | Height | H %   | Area  | A %   | FWHM  |
|---------|--------|-----|--------|-------|-------|-------|-------|
| 16.822  | 5.2660 | 40  | 19     | 5.4   | 457   | 2.0   | 0.376 |
| 22.957  | 3.8708 | 37  | 49     | 13.6  | 898   | 4.0   | 0.315 |
| 25.978  | 3.4271 | 53  | 223    | 62.3  | 3633  | 16.3  | 0.277 |
| 28.219  | 3.1598 | 43  | 55     | 15.4  | 2647  | 11.9  | 0.818 |
| 28.961  | 3.0806 | 43  | 69     | 19.3  | 3308  | 14.8  | 0.815 |
| 31.780  | 2.8135 | 91  | 358    | 100.0 | 22324 | 100.0 | 1.060 |
| 32.319  | 2.7677 | 142 | 295    | 82.4  | 19700 | 88.2  | 1.068 |
| 32.779  | 2.7299 | 106 | 244    | 68.2  | 6548  | 29.3  | 0.456 |
| 34.082  | 2.6285 | 58  | 130    | 36.4  | 3769  | 16.9  | 0.491 |
| 35.336  | 2.5380 | 52  | 20     | 5.7   | 361   | 1.6   | 0.284 |
| 39.159  | 2.2986 | 40  | 68     | 19.0  | 2699  | 12.1  | 0.634 |
| 39.742  | 2.2662 | 55  | 82     | 22.9  | 3626  | 16.2  | 0.752 |
| 41.902  | 2.1542 | 50  | 27     | 7.7   | 619   | 2.8   | 0.384 |
| 43.943  | 2.0588 | 47  | 47     | 13.1  | 781   | 3.5   | 0.282 |
| 45.464  | 1.9934 | 55  | 31     | 8.7   | 264   | 1.2   | 0.136 |
| 46.741  | 1.9419 | 75  | 115    | 32.2  | 3619  | 16.2  | 0.533 |
| 48.148  | 1.8884 | 81  | 65     | 18.0  | 1273  | 5.7   | 0.335 |
| 49.128  | 1.8530 | 80  | 39     | 10.9  | 2068  | 9.3   | 0.845 |
| 49.520  | 1.8392 | 80  | 206    | 57.6  | 5300  | 23.7  | 0.437 |
| 50.400  | 1.8091 | 80  | 76     | 21.3  | 2078  | 9.3   | 0.464 |
| 51.150  | 1.7844 | 80  | 62     | 17.4  | 1729  | 7.7   | 0.473 |
| 51.940  | 1.7591 | 65  | 60     | 16.6  | 1451  | 6.5   | 0.414 |
| 53.341  | 1.7161 | 59  | 107    | 29.9  | 2267  | 10.2  | 0.360 |
| 54.437  | 1.6841 | 49  | 9      | 2.5   | 80    | 0.4   | 0.143 |
| 55.781  | 1.6467 | 49  | 30     | 8.3   | 637   | 2.9   | 0.342 |
| 57.092  | 1.6119 | 51  | 26     | 7.1   | 337   | 1.5   | 0.211 |
| 58.425  | 1.5783 | 51  | 16     | 4.5   | 311   | 1.4   | 0.306 |
| 60.194  | 1.5361 | 55  | 17     | 4.8   | 457   | 2.0   | 0.428 |
| 61.659  | 1.5031 | 66  | 24     | 6.7   | 320   | 1.4   | 0.213 |
| 62.993  | 1.4744 | 79  | 29     | 8.1   | 277   | 1.2   | 0.153 |

Peak Search Report (30 Peaks, Max P/N = 8.4)
SCAN: 10.0/70.0/0.02/2(sec), Cu, I(p) = 467.0, 04/07/09 12:21p
PEAK: 39 (pts)/Parabolic Filter, Threshold = 3.0, Cutoff = 0.1%, BG = 3/1.0,
NOTE:
Intensity = Counts, 2T(0) = 0.0 (deg), Wavelength to Compute d-Spacing = 1.54059 Å (Cu/K-alpha1)

Example 2

Recrystallization of C-FAP from Component Parts

In a solution of ~50 milliliters of concentrated Hydrochloric Acid at 50-70° C., can be added $CaF_2$, $Ca_3(PO_4)_2$, and $Ca(CO_3)$ while stirring. Concentrated Ammonium hydroxide (aq) can then be added drop-wise over the course of 30 minutes to precipitate the crystalline form of C-FAP ($Ca_5(PO_4)_3F$) and neutralize the solution. The solid can be strained from the liquid using a Buchner funnel, and washed 3 times with liberal amounts of deionized water. The solid can be dried first at room temperature in a fume hood for 1 day and then placed into a drying oven at 125° C. for 3 days. A salt of ytterbium can also be added to the solution prior to addition of the ammonium hydroxide to form Yb:C-FAP [$Yb^{3+}$:$Ca_5(PO_4)_3$F].

Although the foregoing invention has been described in some detail by way of illustration and example for purposes of clarity of understanding, one of skill in the art will appreciate that certain changes and modifications may be practiced within the scope of the appended claims. In addition, each reference provided herein is incorporated by reference in its entirety to the same extent as if each reference was individually incorporated by reference. Where a conflict exists between the instant application and a reference provided herein, the instant application shall dominate.

What is claimed is:

1. A method of preparing a crystalline form of a compound of formula I:

$$(A_{1-n}Y_n)_5(PO_4)_3X \quad (I)$$

wherein
A is selected from the group consisting of Ca, Sr and Ba,
Y is a dopant selected from the group consisting of Yb, Nd, Ce, Cr, Tm, Ho, Er, and Sm,
subscript n is from 0 to about 0.1, and
X is selected from the group consisting of F, Cl and OH,
the method comprising:
dissolving the compound of formula I in an aqueous solution comprising an acid, wherein the solution is at a temperature of from about 0 to about 100° C.; and
forming a supersaturated solution of the compound of formula I, thereby preparing the crystalline form of the compound of formula I.

2. The method of claim 1, wherein the acid is selected from the group consisting of hydrochloric, nitric, phosphoric, perchloric and sulfuric acid.

3. The method of claim 1, wherein the aqueous solution further comprises a member selected from the group consisting of a dispersant, an enzyme and an organic template.

4. The method of claim 1, wherein the method prepares single crystals of the compound of formula I.

5. The method of claim 1, wherein the method further comprises adding a base to neutralize the solution.

6. The method of claim 5, wherein the base is selected from the group consisting of ammonium hydroxide, an amine, urea, sodium hydroxide, potassium hydroxide, an alkaline earth hydroxide, calcium hydroxide, and calcium carbonate.

7. The method of claim 6, wherein the base is selected from the group consisting of ammonium hydroxide, an amine, and urea.

8. The method of claim 1, wherein the method further comprises slow evaporation of the aqueous solution.

9. The method of claim 1, wherein the method further comprises decreasing the temperature of the aqueous solution.

10. The method of claim 1, wherein the method further comprises adding a seed crystal to the aqueous solution.

11. The method of claim 1, wherein the method comprises dissolving in the aqueous solution a salt of the dopant Y and a compound of formula Ia:

$$A_5(PO_4)_3X \qquad (Ia).$$

12. The method of claim 1, the method comprising:
dissolving $Ca_5(PO_4)_2F$ and a ytterbium salt in an aqueous solution comprising concentrated hydrochloric acid, wherein the solution is at a temperature of from about 0 to about 100° C.; and
adding concentrated ammonium hydroxide to neutralize the solution, thereby preparing a crystalline form of $(Ca_{1-n}Yb_n)_5(PO_4)_3F$, wherein subscript n is about 0.01.

13. A crystalline form of a compound of formula Ib:

$$(Ca_{1-n}Yb_n)_5(PO_4)_3F \qquad (Ib)$$

wherein subscript n is about 0.01, and
wherein the X-ray crystal structure of the compound has the following 2-theta peaks: 25.978, 31.780, 32.319, 32.779, 34.082 and 49.520,
the compound prepared by the process comprising:
dissolving $Ca_5(PO_4)_3F$ in an aqueous solution comprising concentrated hydrochloric acid and ytterbium, wherein the solution is at a temperature of from about 0 to about 100° C.; and
adding concentrated ammonium hydroxide to the solution to neutralize the solution, thereby preparing the crystalline form of $(Ca_{1-n}Yb_n)_5(PO_4)_3F$, where subscript n is about 0.01, thereby preparing the crystalline form of the compound of formula Ib.

14. The crystalline compound of claim 13, wherein the X-ray crystal structure of the compound has the following 2-theta peaks: 25.978, 28.961, 31.780, 32.319, 32.779, 34.082, 39.159, 39.742, 46.741, 49.520, 50.400 and 53.341.

15. The crystalline compound of claim 13, wherein the X-ray crystal structure of the compound has the following 2-theta peaks: 16.822, 22.597, 25.978, 28.219, 28.961, 31.780, 32.319, 32.779, 34.082, 35.336, 39.159, 39.742, 41.902, 43.943, 45.464, 46.741, 48.148, 49.128, 49.520, 50.400, 51.150, 51.940, 53.341, 54.437, 55.781, 57.092, 58.425, 60.194, 61.659 and 62.993.

16. A method of preparing a crystalline form of a compound of formula I:

$$(A_{1-n}Y_n)_5(PO_4)_3X \qquad (I)$$

wherein
A is selected from the group consisting of Ca, Sr and Ba,
Y is a dopant selected from the group consisting of Yb, Nd, Ce, Cr, Tm, Ho, Er, and Sm,
subscript n is from about 0.001 to about 0.1, and
X is selected from the group consisting of F, Cl and OH,
the method comprising:
dissolving an alkaline earth fluoride, an alkaline earth phosphate, an alkaline earth carbonate and a salt of the dopant Y in an aqueous solution comprising an acid, wherein the solution is at a temperature of from about 0 to about 100° C.; and
forming a supersaturated solution of the compound of formula I, thereby preparing a crystalline form of the compound of formula I.

17. The method of claim 16, wherein the method comprises dissolving $CaF_2$, $Ca_3(PO_4)_2$, $Ca(CO_3)$ and a ytterbium salt in the aqueous solution.

* * * * *